US009385674B2

(12) United States Patent
Doy

(10) Patent No.: US 9,385,674 B2
(45) Date of Patent: Jul. 5, 2016

(54) DYNAMIC SPEAKER MANAGEMENT FOR MULTICHANNEL AUDIO SYSTEMS

(71) Applicant: Maxim Integrated Products, Inc., San Jose, CA (US)

(72) Inventor: Anthony S. Doy, Los Gatos, CA (US)

(73) Assignee: Maxim Integrated Products, Inc., San Jose, CA (US)

( * ) Notice: Subject to any disclaimer, the term of this patent is extended or adjusted under 35 U.S.C. 154(b) by 249 days.

(21) Appl. No.: 14/067,843

(22) Filed: Oct. 30, 2013

(65) Prior Publication Data

US 2014/0140535 A1    May 22, 2014

Related U.S. Application Data

(60) Provisional application No. 61/721,015, filed on Oct. 31, 2012, provisional application No. 61/721,010, filed on Oct. 31, 2012, provisional application No. 61/721,021, filed on Oct. 31, 2012.

(51) Int. Cl.
| | |
|---|---|
| *H03G 5/00* | (2006.01) |
| *H03G 3/00* | (2006.01) |
| *H04M 9/08* | (2006.01) |
| *H03G 9/02* | (2006.01) |

(52) U.S. Cl.
CPC ............... *H03G 3/00* (2013.01); *H03G 9/025* (2013.01); *H04M 9/082* (2013.01)

(58) Field of Classification Search
CPC ....... H03G 5/165; H03G 5/025; H03G 5/005; H04R 3/04; H04R 3/14; H04R 3/12; H04R 1/26; H04R 5/02
See application file for complete search history.

(56) References Cited

U.S. PATENT DOCUMENTS

| | | | | | |
|---|---|---|---|---|---|
| 4,567,607 | A | * | 1/1986 | Bruney | H04S 1/002 381/1 |
| 4,638,505 | A | * | 1/1987 | Polk | H04S 3/00 381/300 |
| 7,206,419 | B1 | * | 4/2007 | Poletti | G10H 3/187 381/98 |
| 2003/0206624 | A1 | * | 11/2003 | Domer | H04M 9/082 379/406.01 |
| 2007/0168183 | A1 | * | 7/2007 | Van De Kerkhof | G10L 19/008 704/200.1 |
| 2009/0042524 | A1 | * | 2/2009 | Maiuzzo | H04B 1/1036 455/188.1 |
| 2011/0280407 | A1 | * | 11/2011 | Skinner | H03G 3/3005 381/28 |
| 2012/0250893 | A1 | * | 10/2012 | Carroll | H03G 7/007 381/107 |

OTHER PUBLICATIONS

Bortoni, ConstÂncio et al., "Real-Time Voice-Coil Temperature and Cone Displacement Control of Loudspeakers", AES 117th Convention, San Francisco, CA, Oct. 2004, pp. 2-8.

* cited by examiner

*Primary Examiner* — Simon Sing
(74) *Attorney, Agent, or Firm* — TIPS Group

(57) ABSTRACT

A multiband limiter with selective sideband linking includes first and second frequency band splitters, a first and second plurality of limiters, first and second summers, and a plurality of selectable links coupling the first plurality of limiters to the second plurality of limiters. The first plurality of limiters each have a band input coupled to one of the first plurality of band outputs, a link port and a limiter output, and the first summer is receptive to the limiter outputs of the first plurality of limiters and has a first channel output. The second plurality of limiters each have a band input coupled to one of the second plurality of band outputs, a link port and a limiter output, and the second summer is receptive to the limiter outputs of the second plurality of limiters and has a second channel output.

16 Claims, 3 Drawing Sheets

DYNAMIC SPEAKER MANAGEMENT FOR MULTICHANNEL AUDIO SYSTEMS

CROSS REFERENCE TO RELATED APPLICATION(S)

This application claims the benefits of provisional patent applications U.S. Ser. Nos. 61/721,015, 61/721,010 and 61/721,021, all filed Oct. 31, 2012, all of which are incorporated herein by reference.

BACKGROUND

Dynamic speaker management ("DSM") uses the principle of dynamically maximizing speaker cone excursion at the expense of modifying the frequency response of the replayed material, based upon the content of the content of the program material. DSM allows dynamic boosting of portions of the frequency spectrum to maximize sound pressure level or "SPL." Ultimately, this is constrained by cone excursion and/or amplifier drive capability. An example functionality of a DSM system is illustrated in FIG. 1.

Gain reduction or boost in DSM systems is typically implemented using multi-band limiters, where the spectrum is split into defined segments, each of which is maximized in amplitude and then are recombined to constitute the output signal. FIG. 2 is a block diagram illustrating a simplified signal processing path of a typical implementation. The incoming signal is split into various frequency bands, 1 through n. Each band is then passed through its own limiter function to maximize signal content within set limitations. The DSM system then applies variable thresholds to the limiters by extracting speaker parameters in real time through current and voltage sensing of the output signal. Each limiter makes independent decisions where the gain is limited, in each, to a known level.

The dynamic, program dependent alteration of frequency works well with single ("mono") speaker implementations. However in stereo implementations, the audio stereo image can be adversely affected if DSM is applied independently to each channel. For each channel, the instantaneous frequency responses could be radically different depending on content, with the effect being worsened for multichannel implementations. This effect is referred to as "image shift" or "image distortion."

The image shift problem has been addressed in the prior art with a technique known as "sidechain linking", where corresponding limiters of each stereo channel are permanently linked together so that the gain reduction for each frequency band in each channel is always the same. This cures image shift, but at the downside of a significant decrease in overall SPL. That is, if content in one channel does not need to be attenuated, but is being overridden by content in its linked channel, then the SPL maximization is not being utilized fully for the channel not needing attenuation.

These and other limitations of the prior art will become apparent to those of skill in the art upon a reading of the following descriptions and a study of the several figures of the drawing.

SUMMARY

In an embodiment, set forth by way of example and not limitation, a multiband limiter with selective sideband linking includes first and second frequency band splitters, a first and second plurality of limiters, first and second summers, and a plurality of selectable links coupling the first plurality of limiters to the second plurality of limiters. The first frequency band splitter has a first channel input and a first plurality of frequency band outputs. The first plurality of limiters each have a band input coupled to one of the first plurality of band outputs, a link port and a limiter output, and the first summer is receptive to the limiter outputs of the first plurality of limiters and has a first channel output. The second frequency band splitter has a second channel input and a second plurality of frequency band outputs. The second plurality of limiters each have a band input coupled to one of the second plurality of band outputs, a link port and a limiter output, and the second summer is receptive to the limiter outputs of the second plurality of limiters and has a second channel output.

In another embodiment, set forth by way of example and not limitation, a method for controlling a multiband limiter comprising includes determining which of a first plurality of limiters associated with a first channel are to be linked with a corresponding second plurality of limiters associated with a second channel, and selectively linking the first plurality of limiters with the second plurality of limiters.

In a further embodiment, a method for controlling a multiband limiter includes receiving control input data at a digital controller for a multiband limiter including a plurality of band limiters; determining on the digital controller if band limiter parameters should be changed and, if so, adjusting one or more of the band limiters; and determining on the digital controller if sidechain linkages between band limiters should be changed and, if so, adjusting one or more sidechain linkages.

An advantage of certain examples is that corresponding band limiters of a plurality of channels can be selectively linked to reduce image distortion while allowing the remaining band limiters to operate independently to maximize overall SPL.

These and other embodiments, features and advantages will become apparent to those of skill in the art upon a reading of the following descriptions and a study of the several figures of the drawing.

BRIEF DESCRIPTION OF THE DRAWINGS

Several example embodiments will now be described with reference to the drawings, wherein like components are provided with like reference numerals. The example embodiments are intended to illustrate, but not to limit, the invention. The drawings include the following figures.

DETAILED DESCRIPTION OF EXAMPLE EMBODIMENT(S)

Figure 1:
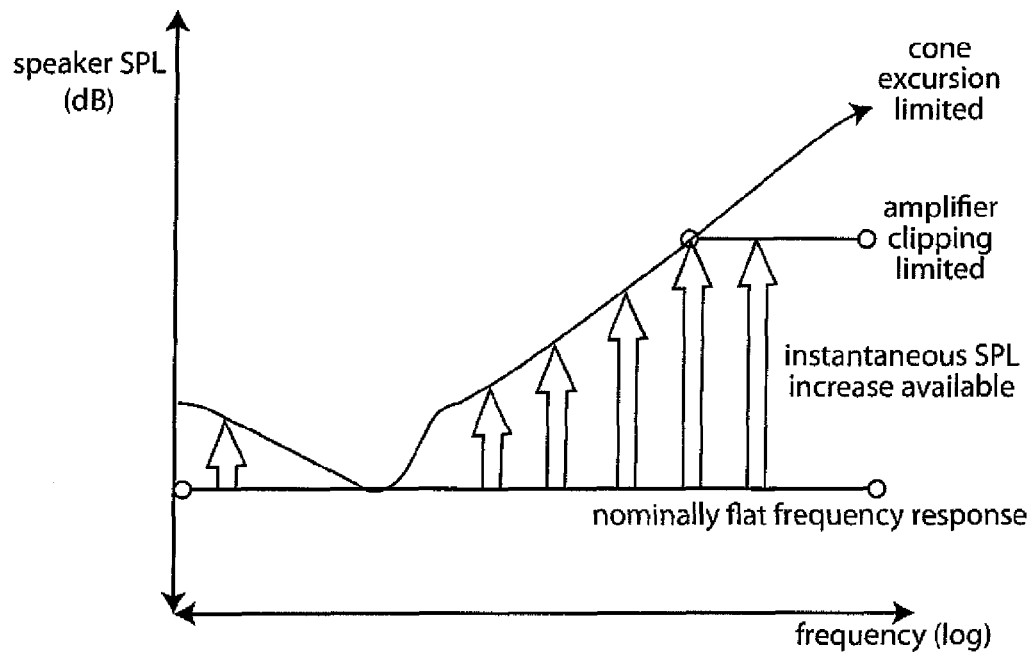
FIG. 1 is a graph illustrating a functionality of a DSM system.
Figure 2:
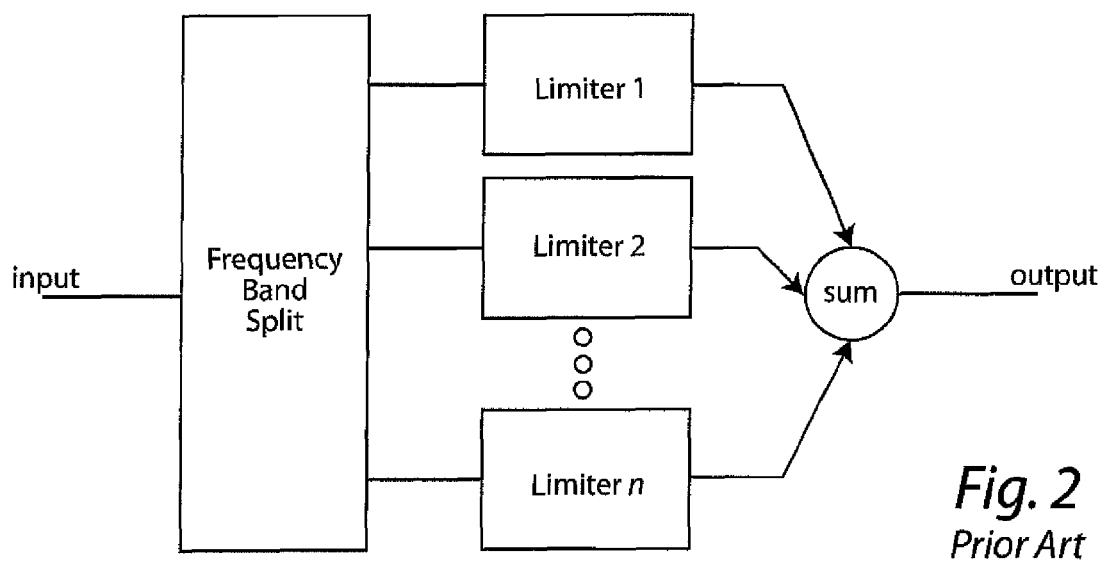
FIG. 2 is a block diagram of a conventional multiband limiter for a DSM system.
Figure 3:
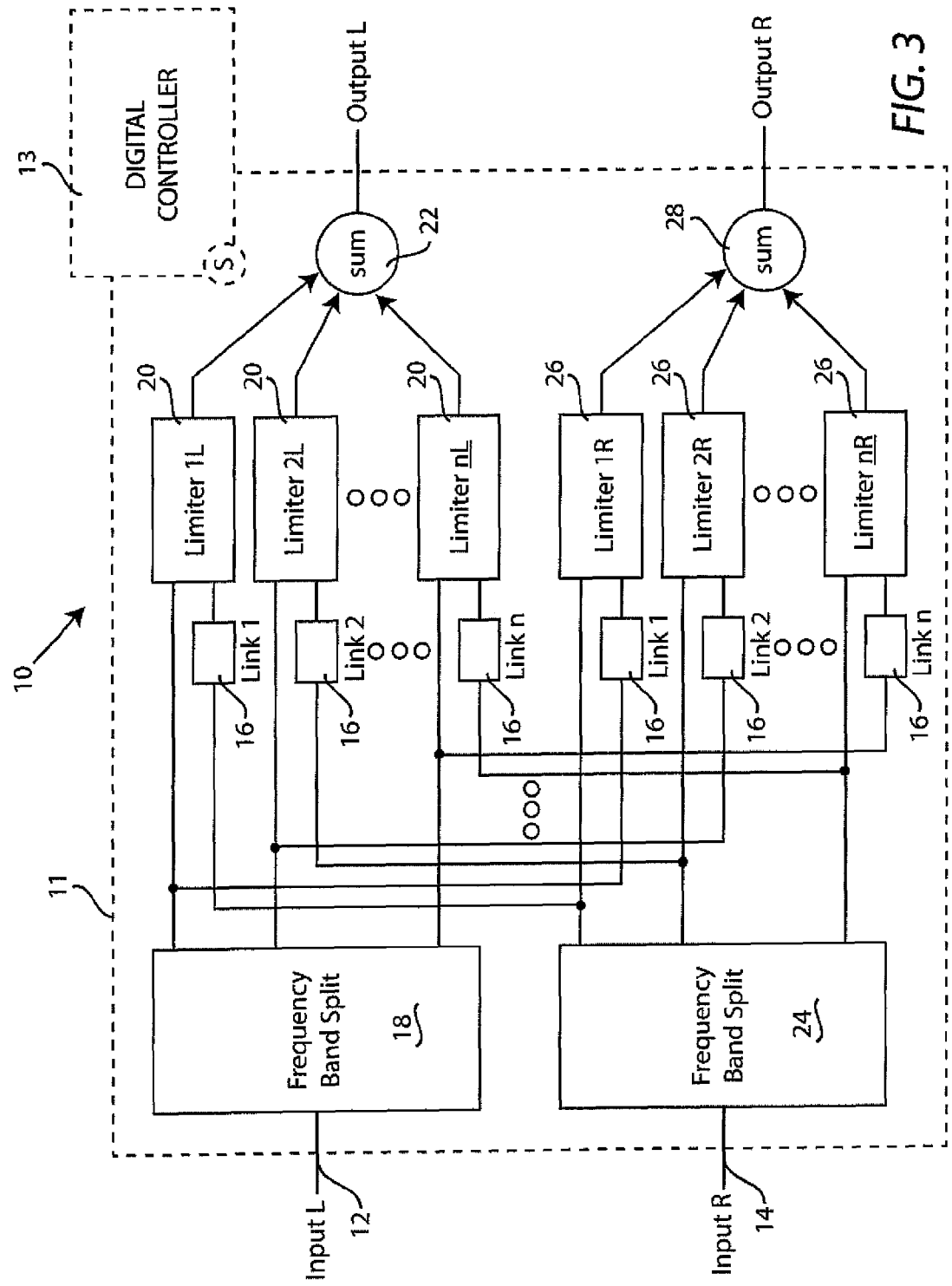
FIG. 3 is a block diagram of a stereo multiband limiter for a DSM system with selective sideband linking.

FIGS. 1 and 2 were discussed with reference to the prior art. FIG. 3 is a block diagram, set forth by way of example and not limitation, of a stereo multiband limiter for a dynamic speaker management ("DSM") system 10 including a multiband limiter 11 and a digital controller 13. The multiband limiter 11 has selectively linked sidechains of band limiters to limit the effects of image shifting on selected bands while maximizing SPL on other bands.

In FIG. 3, the example multiband limiter 11 includes a first (e.g. left) channel input 12, a second (e.g. right) channel input 14 and a plurality of selective sidechain links 16. In the left channel 12 a multi-frequency input signal L is split into different frequency bands (1, 2 ... n) by a first frequency band splitter 18. The n outputs of first frequency band splitter 18 are then input into left channel limiters 20, and the outputs of the left channel limiters are summed in a summer 22 to produce a left channel output L.

In the right channel input 14, a multi-frequency input signal R is split into different frequency bands (1, 2 ... n) by frequency band splitter 24. The n outputs of frequency band splitter 24 are then input into right channel limiters 26, and the outputs of the right channel limiters 26 are summed in a summer 28 to produce a right channel output R. Selective sidechain links 16 are used to selectively couple left channel limiters 20 to corresponding right channel limiters 26. By "corresponding" it is meant that the linked limiters are of about the same frequency band.

The example embodiment of FIG. 3 will be referred to as a "stereo implementation" in that it has two channels (left and right in this non-limiting example). Without the selective sidechain linking referred to above, the two channels may be changing the gain inconsistently with respect to each other, which can create undesirable audio effects or "artifacts" due to image shift ("distortion"). By selectively linking the pair of corresponding channels, a gain limitation to a band of one of the channels will be applied to the corresponding band of the other of the channels such that the gains of the pair of channels are mutually consistent. Corresponding bands that are not linked together continue to operate independently, ensuring optimal SPL for each band.

It should be noted that DSM system 10, in certain non-limiting example embodiments, applies to the use of multiple DSM enabled amplifiers and can be implemented in a variety of designs. By way of further non-limiting examples, multiple "mono" DSM enabled amplifier devices (e.g. devices having only a single amplifier) may be used, the DSM system 10 may be monolithically integrated, in whole or in part, as an integrated circuit (IC), the DSM system 10 may be made from discrete components.

It will be appreciated that the example DSM system 10 described with reference to FIG. 3 leverages the fact that in a mobile device the speaker positions are constrained in separation by the form factor. For example, a phone speaker separation (d) is typically less than 100 millimeters (mm) on a cell phone and less than 200 mm on a tablet. At these separations, and with the assumption that the users' ears are some distance from the device, stereo image shift effects will only be perceptible in the higher frequency bands (where $\lambda <= d$). Therefore, SPL can be maximized in a stereo or multichannel system by selectively linking sidechains between corresponding limiters depending on the frequency band of interest they cover. As such, the selective linking of corresponding limiters, in certain example embodiments, will be in the range of 0 (zero) to n sidechains, where n is the number of corresponding bands in each channel, in order to achieve a desired balance between a high SPL and low stereo image shift.

In an example embodiment, the low frequency bands can have the limiters running independently on L and R, but for the higher frequency bands the limiters are linked to preserve a stable stereo image. Actual implementations can vary depending upon, by way of non-limiting examples, the: 1) separation of speaker sources; 2) number of frequency bands used in DSM implementation; and 3) subjective stereo image degradation allowable.

Digital controller 13 can be used to control various functions of the multiband limiter 11. By way of non-limiting example, the digital controller can use signals S to set thresholds for the left channel limiters 20 and/or the right channel limiters 26. By way of further non-limiting example, digital controller can control the sidechain links 16. In other embodiments, the sidechain links are factory-set. Digital controller 13 can be implemented in a number of technologies including discrete logic, state machines, microcontrollers, etc. In a non-limiting embodiment, digital controller 13 can be a DSM processor.

Figure 4:
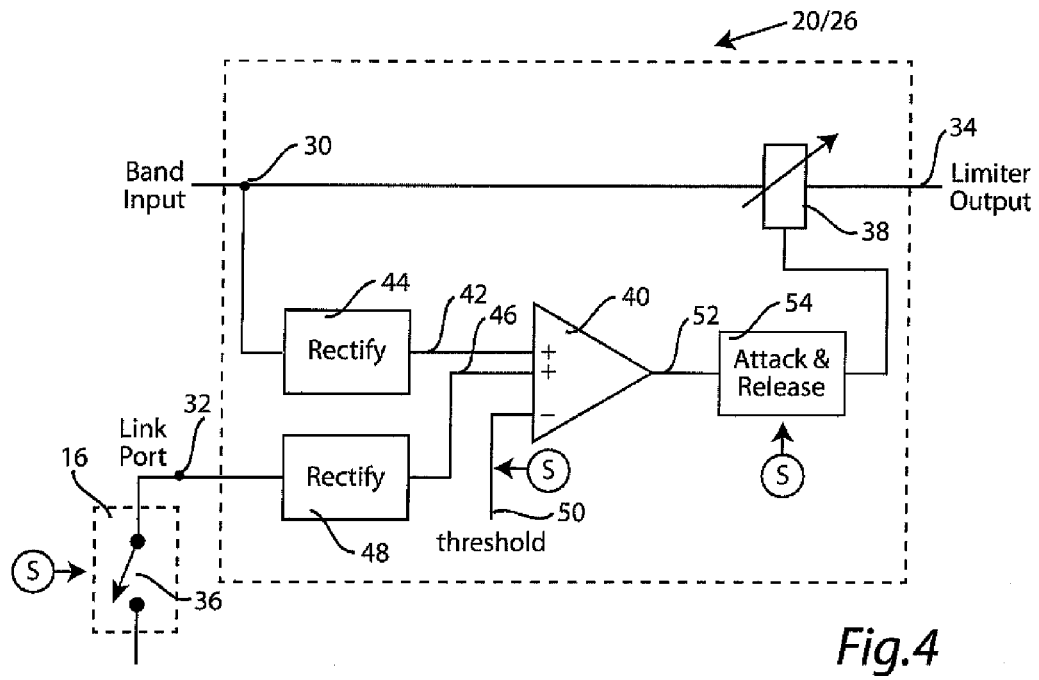
FIG. 4 is a block diagram of a limiter design for the stereo multiband limiter of FIG. 3.

FIG. 4 is a block diagram, set forth by way of example and not limitation, of a limiter 20/26 of FIG. 3. The limiter 20/26 has a band input 30, a link port 32, and a limiter output 34. The link port 32 is coupled to a sidechain link 16, which can include an electrically controllable switch 36. An electrically adjustable attenuator 38 couples the band input 30 to the limiter output 34. A comparator 40 has a first (+) input 42 coupled to the band input 30 by a rectifier 44, a second (+) input 46 coupled to the link port 32 by a rectifier 48, and a third (−) input 50 coupled to a threshold or reference voltage. In this non-limiting example, an output 52 coupled to a control input of attenuator 38 by an attack & release controller 54 which controls the shape and timing of the rising ("attack") and falling (release) edges of the limiter output 34.

Figure 5:
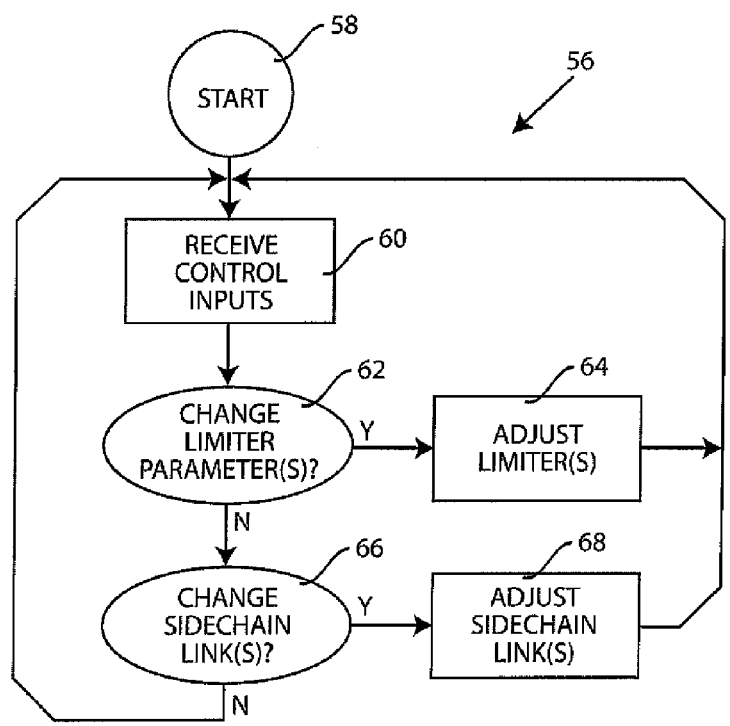
FIG. 5 is a flow diagram of an example process for controlling the stereo multiband limiter of FIG. 3.

FIG. 5 is a flow diagram, set forth by way of example and not limitation, of an example process 56 for controlling the stereo multiband limiter 11 of FIG. 3. In this example, process 56 begins at 58 and, in an operation 60, control inputs are received in, for example, the digital controller 13. These control inputs can include program controls, off-chip signals, measurements of voltage (V) applied to a loudspeaker's coil and the current (I) flowing through the coil, etc., by way of non-limiting examples. Next, in an operation 62, it is determined whether limiter 20/26 parameter(s) should be changed based upon the received control inputs of operation 60. If so, an operation 64 adjusts one or more limiter parameters (e.g. a limiter threshold) and control returns to operation 60. If not, an operation 66 determines if sidechain links 16 should be changed. By way of a non-limiting example, a register may be employed to store the state of the switches 36 of each of the sidechain links 16, where a 0 (zero) signifies an open switch and a 1 (one) signifies a closed switch. The sidechain links may be changed from time-to-time for such purposes of loudness control. If so, the sidechain link(s) 16 are adjusted in an operation 68 and control returns to operation 60. If not, control returns to operation 60 without adjusting the sidechain link(s). As noted, these control operations can be implemented by a digital controller 13 (e.g. a DSM processor) using electrical control signals S.

Although various embodiments have been described using specific terms and devices, such description is for illustrative purposes only. The words used are words of description rather than of limitation. It is to be understood that changes and variations may be made by those of ordinary skill in the art without departing from the spirit or the scope of various inventions supported by the written disclosure and the drawings. In addition, it should be understood that aspects of various other embodiments may be interchanged either in whole or in part. It is therefore intended that the claims be interpreted in accordance with the true spirit and scope of the invention without limitation or estoppel.

What is claimed is:

1. A multiband limiter with selective sideband linking comprising:
   a first frequency band splitter having a first channel input and a first plurality of frequency band outputs;

a first plurality of limiters each having a band input coupled to one of the first plurality of band outputs, a link port and a limiter output;

a first summer receptive to the limiter outputs of the first plurality of limiters and having a first channel output;

a second frequency band splitter having a second channel input and a second plurality of frequency band outputs;

a second plurality of limiters each having a band input coupled to one of the second plurality of band outputs, a link port and a limiter output;

a second summer receptive to the limiter outputs of the second plurality of limiters and having a second channel output; and a plurality of selectable links coupling link ports of the first plurality of limiters to link ports of the second plurality of limiters, whereby, the links being controlled by a digital controller.

2. A multiband limiter with selective sideband linking as recited in claim 1 wherein the plurality of selectable links comprises a plurality of switches.

3. A multiband limiter with selective sideband linking as recited in claim 2 wherein the plurality of switches is electrically controllable.

4. A multiband limiter with selective sideband linking as recited in claim 3 wherein the plurality of switches are controlled by the digital controller.

5. A multiband limiter with selective sideband linking as recited in claim 4 wherein the digital controller is a dynamic speaker management (DSM) processor.

6. A multiband limiter with selective sideband linking as recited in claim 1 wherein the first plurality of limiters and the second plurality of limiters each include an attenuator coupling between the band input to the channel output.

7. A multiband limiter with selective sideband linking as recited in claim 6 wherein first plurality of limiters and the second plurality of limiters each include a comparator having a first input coupled to the band input, a second input coupled to the link port, a third input coupled to a threshold, and an output coupled to a control input of the attenuator.

8. A multiband limiter with selective sideband linking as recited in claim 7 wherein, for each comparator, the first input is coupled to the band input by a first rectifier and the second input is coupled to the link port by a second rectifier.

9. A multiband limiter with selective sideband linking as recited in claim 8 wherein, for each comparator, the output is coupled to the control input of the attenuator by an attack & release controller.

10. A method for controlling a multiband limiter comprising:

determining on a digital controller which of a first plurality of limiters associated with a first channel are to be linked with a corresponding second plurality of limiters associated with a second channel; and selectively linking the first plurality of limiters with the second plurality of limiters based on the determining operation;

wherein each of the selectively linked limiters are linked by a switch that is electrically controlled by the digital controller.

11. A method for controlling a multiband limiter as recited in claim 10 wherein the selectively linked limiters are of a corresponding frequency band.

12. A method for controlling a multiband limiter comprising:

receiving control input data at a digital controller for a multiband limiter including a plurality of band limiters;

determining on the digital controller if band limiter parameters should be changed and, if so, adjusting one or more of the band limiters; and determining on the digital controller if sidechain linkages between band limiters should be changed and, if so, adjusting one or more sidechain linkages.

13. A method for controlling a multiband limiter as recited in claim 12 wherein adjusting one or more sidechain linkages includes one of opening and closing a switch between a pair of the band limiters.

14. A method for controlling a multiband limiter as recited in claim 13 wherein the pair of band limiters has corresponding frequency bands.

15. A method for controlling a multiband limiter as recited in claim 14 where the digital controller comprises a dynamic speaker management (DSM) processor.

16. A method for controlling a multiband limiter as recited in claim 15 wherein the band limiter parameters include a band limiter threshold.

* * * * *